(12) United States Patent
Lu

(10) Patent No.: US 10,784,810 B1
(45) Date of Patent: Sep. 22, 2020

(54) MOTOR CONTROLLER WITH ACCURATE CURRENT MEASUREMENT

(71) Applicant: Allegro MicroSystems, LLC, Manchester, NH (US)

(72) Inventor: Yisong Lu, Shrewsbury, MA (US)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

(21) Appl. No.: 16/396,877

(22) Filed: Apr. 29, 2019

(51) Int. Cl.
*H02P 27/08* (2006.01)
*H02P 6/14* (2016.01)
*H02P 6/10* (2006.01)

(52) U.S. Cl.
CPC ............ *H02P 27/08* (2013.01); *H02P 6/10* (2013.01); *H02P 6/14* (2013.01)

(58) Field of Classification Search
CPC .................................. H02P 27/08; H02P 6/10
USPC ............................................. 318/400.01, 700
See application file for complete search history.

(56) References Cited

U.S. PATENT DOCUMENTS

| | | | |
|---|---|---|---|
| 7,590,334 B2 | 9/2009 | Yabusaki et al. | |
| 7,747,146 B2 | 6/2010 | Milano et al. | |
| 7,952,310 B2* | 5/2011 | Hamasaki | ............ H02P 6/14 318/400.01 |
| 8,228,012 B2* | 7/2012 | Hamasaki | ............ H02P 27/08 318/400.04 |
| 8,729,841 B2 | 5/2014 | Reynolds et al. | |
| 8,917,043 B2 | 12/2014 | Reynolds et al. | |
| 8,917,044 B2 | 12/2014 | Reynolds et al. | |
| 9,088,233 B2 | 7/2015 | Alcorn et al. | |
| 9,291,876 B2 | 3/2016 | Cadugan et al. | |
| 9,331,612 B2* | 5/2016 | Kuratani | .................. H02P 6/28 |
| 10,312,847 B2 | 6/2019 | Lu | |
| 10,348,223 B1 | 7/2019 | Khosravi et al. | |
| 2012/0163046 A1 | 6/2012 | Hibino | |

(Continued)

FOREIGN PATENT DOCUMENTS

DE 102006052467 A1 5/2008
EP 1347567 A1 9/2003

OTHER PUBLICATIONS

Datasheet, Microchip Technology Inc.; AN1299 "Single-Shunt Three-Phase Current Reconstruction Algorithm for Sensorless FOC of a PMSM" 2009; 24 Pages.

(Continued)

*Primary Examiner* — David Luo
(74) *Attorney, Agent, or Firm* — Daly, Crowley, Mofford & Durkee, LLP

(57) ABSTRACT

A motor control system for reducing or eliminating current ripple error during current sampling comprises a motor having a plurality of phase coils, a motor driver circuit having a plurality of switches coupled to the plurality of phase coils to drive current through the phase coils, and a motor controller circuit configured to provide a plurality of output control signals coupled to the plurality of switches. A phase circuit modifies a first output control signal to produce a modified control signal that is out of phase with a second output control signal. A current measuring circuit is included to measure a current through the motor by measuring the current during a first time period when the first output control signal is active and measuring the current during a second time period when the modified control signal is active.

20 Claims, 6 Drawing Sheets

(56) References Cited

U.S. PATENT DOCUMENTS

| | | |
|---|---|---|
| 2013/0158808 A1 | 6/2013 | Imamura et al. |
| 2014/0055064 A1 | 2/2014 | Ng |
| 2020/0021212 A1 | 1/2020 | Yamada et al. |
| 2020/0028456 A1 | 1/2020 | Morioka et al. |

OTHER PUBLICATIONS

Search Report and Written Opinion dated Jul. 20, 2020 for PCT Application No. PCT/US2020/025657; 13 pages.

* cited by examiner

MOTOR CONTROLLER WITH ACCURATE CURRENT MEASUREMENT

FIELD

This disclosure relates to motor controllers and, more particularly, to motor controllers that measure current flowing through the motor.

BACKGROUND

Circuits to precisely control, drive, and regulate brushless DC ("BLDC") electric motors are required in many applications. These circuits often create pulse-width modulated ("PWM") drive signals that are used to control power to the motor.

BLDC motors may include multiple coils. These coils, when energized, cause the motor to turn. However, for the motor to continuously turn, a motor controller circuit may have to energize one or more (but not all) of the coils at a time, energize the coils in a particular order, energize the coils in a forward and backward direction at different times, etc. The periods of time in which the coils are energized are often referred to as so-called "phases" of the motor. The coil (or coils) that are energized during a phase may be referred to as phase coils.

The sequence and timing of which coils are energized is dependent upon the design of the BLDC motor. As an example, one BLDC motor may have three coils that must be energized in sequence, i.e. a round-robin fashion, in order to turn the motor. Other sequences of energizing the coils may also be used. Such a motor may have three "phases." In each phase, a different one or more of the three coils is energized. As the motor turns, the phase will change, and the motor driver will energize the next one or more coils in order to keep the motor spinning.

As each phase is energized, it physically drives the motor's rotor. The amount of power supplied to the coils may be directly proportional to the amount of torque produced by the motor. In many BLDC motors, the amount of power provided to the coils rises and falls over time as the coils are energized. As a result, the motor does not produce a constant torque output.

Various electric motor drive circuits are described in U.S. Pat. No. 7,590,334 (filed Aug. 8, 2007); U.S. Pat. No. 7,747,146 (filed Aug. 8, 2007), U.S. Pat. No. 8,729,841 (filed Oct. 12, 2011); U.S. patent application Ser. No. 13/595,430 (filed Aug. 27, 2012); U.S. Pat. No. 9,088,233 (filed Dec. 18, 2012); U.S. Pat. No. 9,291,876 (filed May 29, 2013); and U.S. patent application Ser. No. 15/967,841 (filed May 1, 2018), each of which is incorporated here by reference, and each of which is assigned to the assignee of this patent.

SUMMARY

In an embodiment, a system comprises a motor having a plurality of phase coils; a motor driver circuit having a plurality of switches coupled to the plurality of phase coils to drive current through the phase coils; and a motor controller circuit configured to provide a plurality of output control signals coupled to the plurality of switches. Each output control signal is associated with a respective phase coil to control the switches to drive current through the respective phase coil. A phase circuit is included to modify a first output control signal of the plurality of output control signals to produce a modified control signal that is out of phase with a second output control signal of the plurality of output control signals. A current measuring circuit is included to measure a current through at least one of the phase coils by measuring the current during a first time period when the first output control signal is active and measuring the current during a second time period when the modified control signal is active.

One or more of the following features may be included:

The current measuring circuit may be further configured to average the current measured during the first time period and the current measured during the second time period.

The plurality of phase coils may comprise three phase coils.

The plurality of output control signals may comprise three output control signals.

The plurality of output control signals may be pulse-width modulated control signals.

The first time period may correspond to a time period when the modified control signal is high and the second time period corresponds to a time period when the second output control signal is high.

The modified control signal and the second output control signal may be about 180 degrees out of phase.

The current measuring circuit may be configured to measure the current at a midpoint of the first time period and at a midpoint of the second time period.

A single shunt resistor may be coupled to the current measuring circuit.

The phase circuit may comprise a phase shift circuit that shifts the center of the first output control signal by a half-period.

In another embodiment, a circuit comprises a motor driver circuit having a plurality of switches configured to be coupled to a plurality of phase coils of a motor to drive current through the plurality of phase coils of the motor; and a motor controller circuit configured to provide a plurality of output control signals coupled to the plurality of switches. Each output control signal is associated with a respective phase coil to control the switches to drive current through the respective phase coil. A phase circuit is provided to modify a first output control signal of the plurality of output control signals to produce a modified control signal that is out of phase with a second output control signal of the plurality of output control signals. A current measuring Circuit is provided to measure a current through at least one of the phase coils by: measuring the current during a first time period when the modified control signal is active; and measuring the current during a second time period when the second output control signal is active.

One or more of the following features may be included:

The current measuring circuit may be further configured to average the current measured during the first time period and the current measured during the second time period.

The plurality of phase coils may comprise three phase coils.

The plurality of output control signals may comprise three output control signals.

The output control signals may be pulse-width modulated control signals.

The first time period may correspond to a time period when the modified control signal is high and the second time period corresponds to a time period when the second output control signal is high.

The modified control signal and the second output control signal may be about 180 degrees out of phase.

The current measuring circuit may be configured to measure the current at a midpoint of the first time period and at a midpoint of the second time period.

A single shunt resistor may be coupled to the current measuring circuit.

The phase circuit may comprise an inverter.

In another embodiment, a circuit comprises a motor driver circuit having a plurality of switches configured to be coupled to a plurality of phase coils of a motor to drive current through the plurality of phase coils and means for measuring an average current through at least one of the phase coils.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
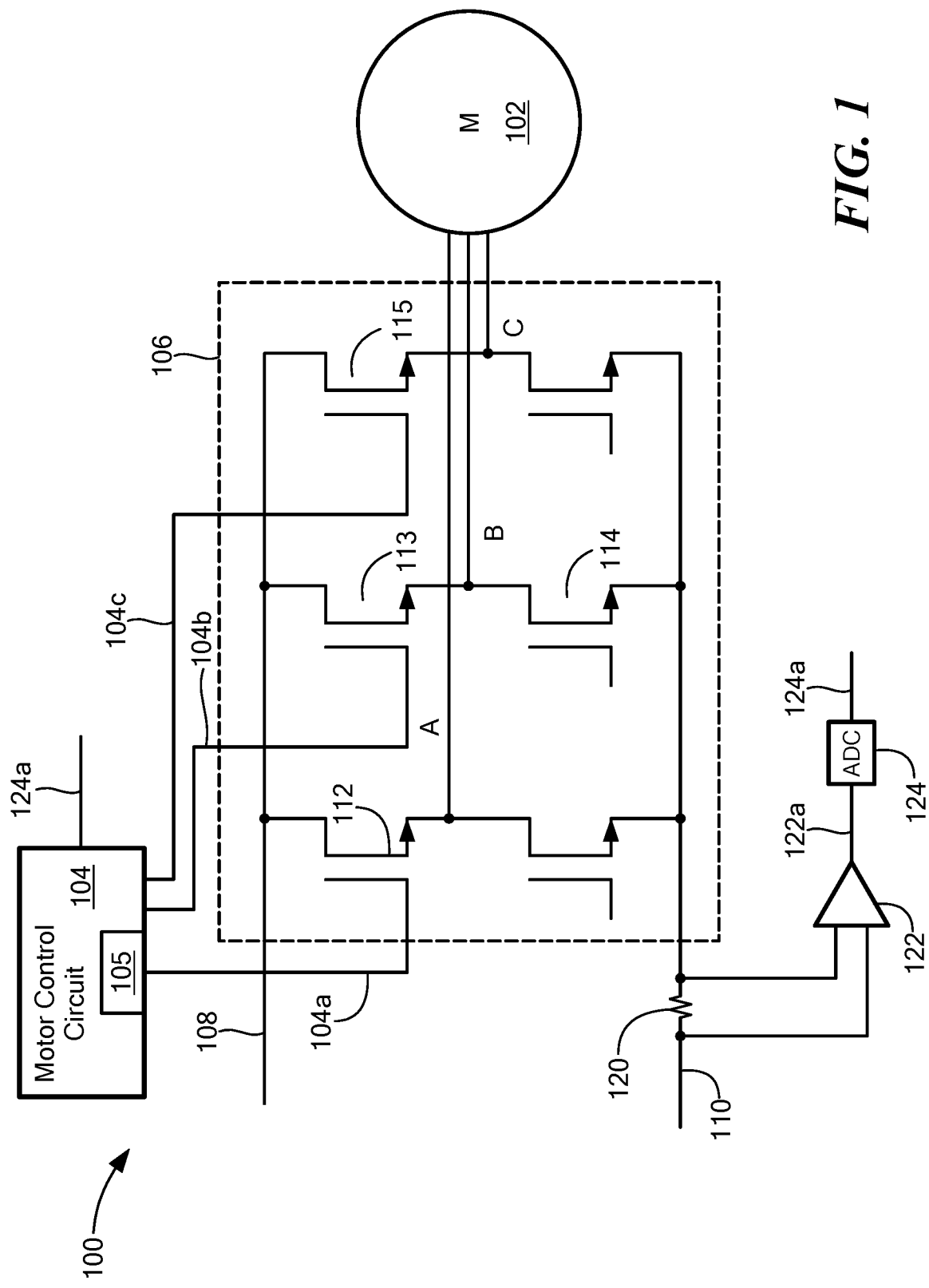
FIG. 1 is a circuit diagram of a motor control system.

FIG. 1 is a circuit diagram of a motor control system 100 for controlling motor 102. Motor control system 100 includes a motor control circuit 104 coupled to motor driver circuit 106. Motor driver circuit 106 is coupled to motor 102 and provides power to motor 102. In embodiments, motor control circuit 104 may be a non-sinusoidal brushless DC motor control circuit.

In the example shown in FIG. 1, motor 102 is a three-phase motor. Accordingly, motor driver circuit 106 has six field effect transistor (FET) switches coupled in pairs between power line 108 and return line 110. The nodes between the pairs (i.e. nodes A, B, and C) are coupled to the coils of motor 102. As the FET switches open and close, they provide power to motor 102 and provide a return path from motor 102. For example, if FET switch 112 and FET switch 114 are closed (e.g. in a conducting state) while the other FET switches are open (e.g. in a non-conducting state), current may flow from power line 108, through FET switch 112 to node A, from node A through the internal coils of motor 102 to node B, and from node B through FET switch 114 to ground.

For ease of illustration, only the gate of FET switches 112, 113, and 115 are shown coupled to motor control circuit 104. However, in embodiments, the gate of each FET switch within motor driver circuit 106 may be coupled to motor control circuit 104. Motor control circuit 104 may drive the gates of each FET switch with various signals (e.g. signals 104a, 104b, and 104c) to selectively open and close the FET switches. This effectively drives motor 102 by directing power to the coils of motor 102. One skilled in the art will recognize that, in other embodiments, the FET switches may be replaced by any device that can act as a switch such as a bipolar junction transistor ("BJT"), a relay, etc.

In embodiments, motor control signals 104a, 104b, and 104c may be pulse width modulated ("PWM") signals. As the PWM on-time increases from zero to one hundred percent, the amount of current supplied to the motor increases proportionally from zero to its maximum value. Thus, motor control circuit 104 can control the amount of current supplied to motor 102 by altering the pulse width of signals 104a-c.

In embodiments, motor control circuit 104 may include a phase circuit 105 that modifies signal 104a so that signal 104a (and thus phase A) is 180 degrees out of phase with signal 104b (i.e. phase B). The timing and phase of phase signals 104a-104c will be discussed in greater detail below.

Motor control system 100 may include sensors to measure the current supplied to (or returning from) motor 102. To measure the current flowing through motor 102, motor control system 100 may include a shunt resistor 120 in the current path. The inputs of differential amplifier 122 may be coupled across shunt resistor 120. Thus, amplified signal 122a (i.e. the output of differential amplifier 122) may represent the voltage across shunt resistor 120. ADC 124 may convert amplified signal 122a into digital signal 124a, which may also represent the voltage across shunt resistor 120. Because the resistance of shunt resistor 120 is known, motor control circuit 104 may use the voltage across shunt resistor 120 to measure the current flowing through motor 102. Thus, digital signal 124a may also represent a measured current.

In embodiments, the shunt resistor 120 may have a very small resistance so that it does not greatly impede the current flow and also does not dissipate a large amount of power. A typical value for shunt resistor 120 may be 0.1 Ohms or less. Also, although shunt resistor 120 is shown coupled to return line 110 to measure the current returning from motor 102 (Iout), shunt resistor 120 could be coupled to power line 108 to measure the current flowing into motor 102 (Iin).

In embodiments, signal 124a may be coupled to and received by motor control circuit 104, which may allow motor control circuit 104 to measure and calculate the current through motor 102. For example, during operation, motor control circuit 104 may periodically sample signal 124a at various times. Motor control circuit 104 may use the sampled value directly or may perform mathematical operations on the samples (for example, computing an average of the samples) to determine the magnitude of current flowing through motor 102. Motor control circuit 104 may then use the measured current as a parameter for controlling motor 102.

Although motor 102 may have multiple phases, a single shunt resistor 120 may be used to measure the current. Because shunt resistor is located on return path 108 (or alternatively on power line 108), the current through shunt resistor 120 will reflect the current through the active motor phase. In order to sense the current associated with each of the motor phases A, B, and C (the summation of which equals zero), it is only necessary to sample the current during two of the three motor phases from which the third motor phase current can be calculated. In other words, the current through the shunt resistor 120 can be sampled during phase A to detect the phase A current, and then can also be sampled during phase B to detect the phase B current, and then the phase C motor current can be calculated from the detected phase A and phase B currents based on the equation IA+IB+IC=0.

Figure 2:
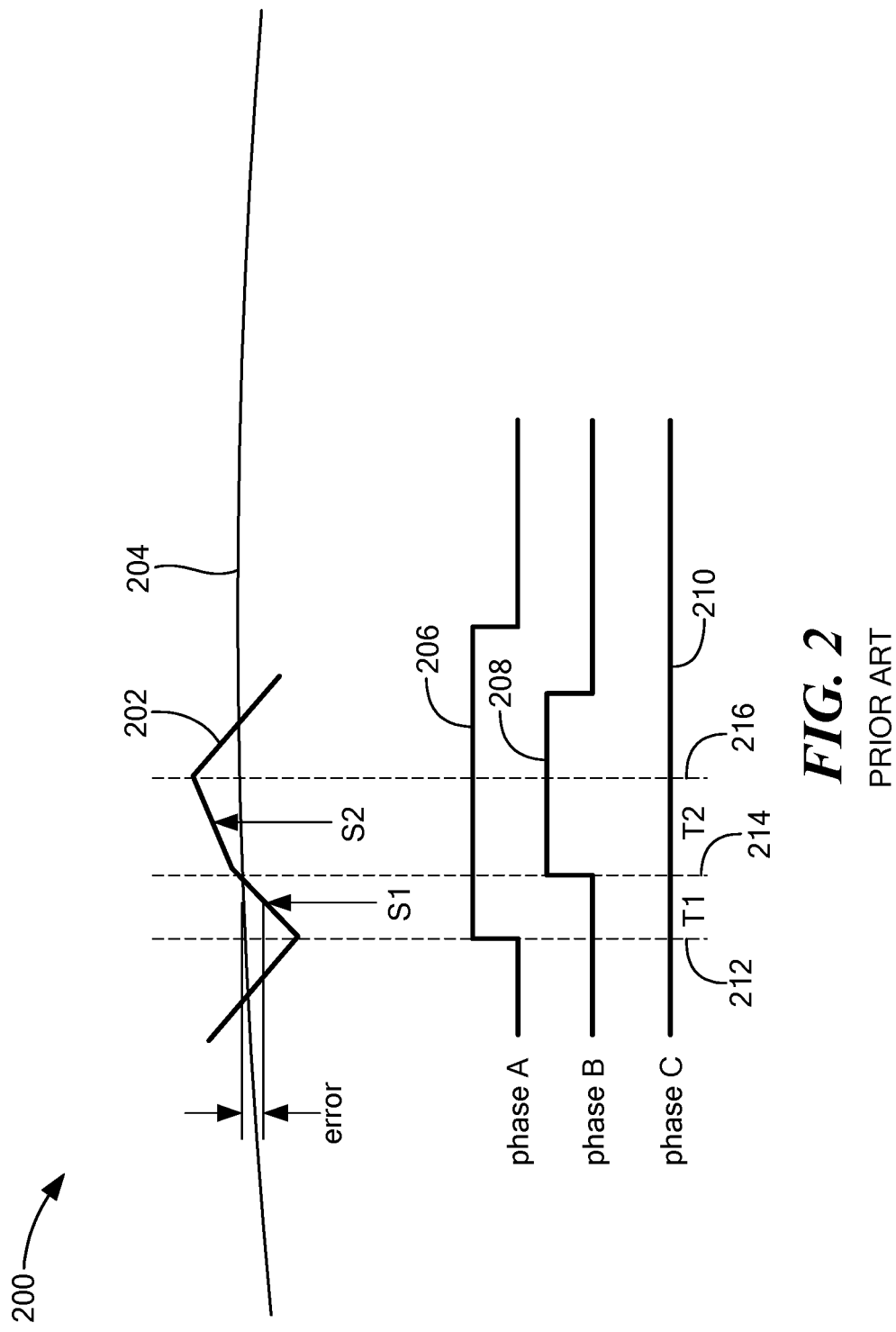
FIG. 2 is a graph of motor current and phase signals.

Referring to FIG. 2, graph 200 illustrates a potential error in calculating average motor phase current when a motor is driven by a motor control circuit of the prior art. Waveform 202 represents the real current for one phase of the motor. Waveform 204 represents the average phase A current through the motor. Waveforms 206, 208, and 210 represent control signals that activate each phase of the motor.

Waveforms 206, 208, and 210 illustrate traditional two-phase modulation for controlling a motor. In this type of modulation, during each PWM cycle, two of the three phases toggle and the center of the high pulse of each active phase is aligned (i.e., at time 216). In the illustrated example, the phase A motor control signal 206 transitions from low to high at time 212, then the phase B motor control signal 208 transitions high at time 214 while phase A signal 206 is still high. Sampling of the phase A current occurs at point S1, midway between time 212 and 214, and again at point S2 after time 214.

As shown by waveform 202, the phase current through motor 102 has ripple. In embodiments, the ripple may have a frequency equal to the PWM frequency for the phase and an amplitude related to the inductance of the motor winding. Sampling the current randomly over time may introduce an error that may be as large as the amplitude of the ripple. Averaging samples S1 and S2 within time periods T1 and T2 and using S1 and S2 to compute an average current does not guarantee that the calculated average current will be accurate (i.e., will reflect the average current 204) because S1 and S2 are not sampled at times when the average current 204 is crossing the real current 202.

Figure 3:
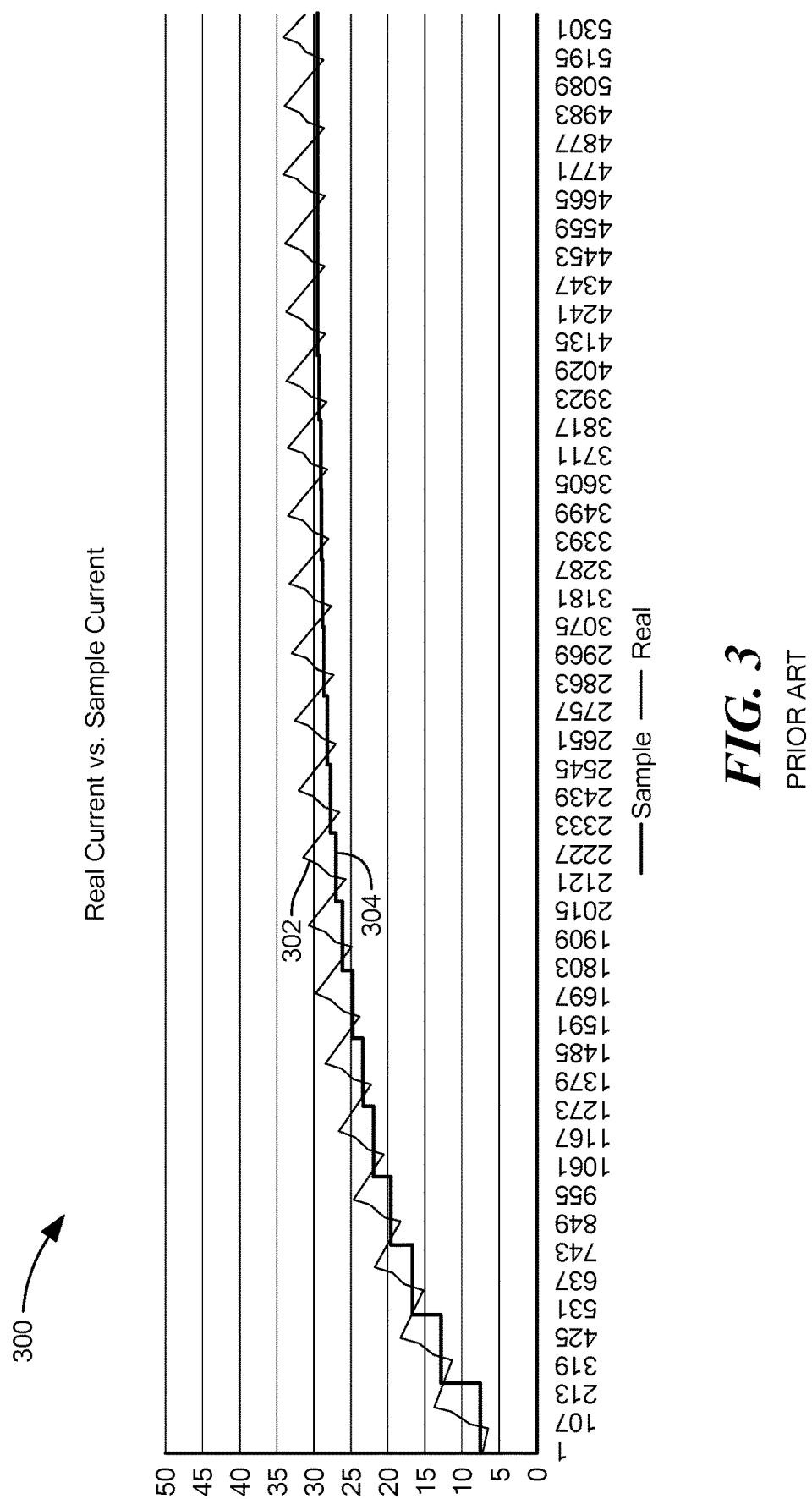
FIG. 3 is a graph of actual motor current and sampled motor current.

Referring to FIG. 3, graph 300 includes waveform 302 representing the real current through a motor phase and waveform 304 representing the sampled current in a motor control circuit of the prior art. The vertical axis represents arbitrary units of current and the horizontal axis represents arbitrary units of time. As shown, the sampled current 304 is not centered with respect to the ripple of the real current 302, indicating that the sampled current contains an error and does not accurately indicate the average motor current.

Figure 4:
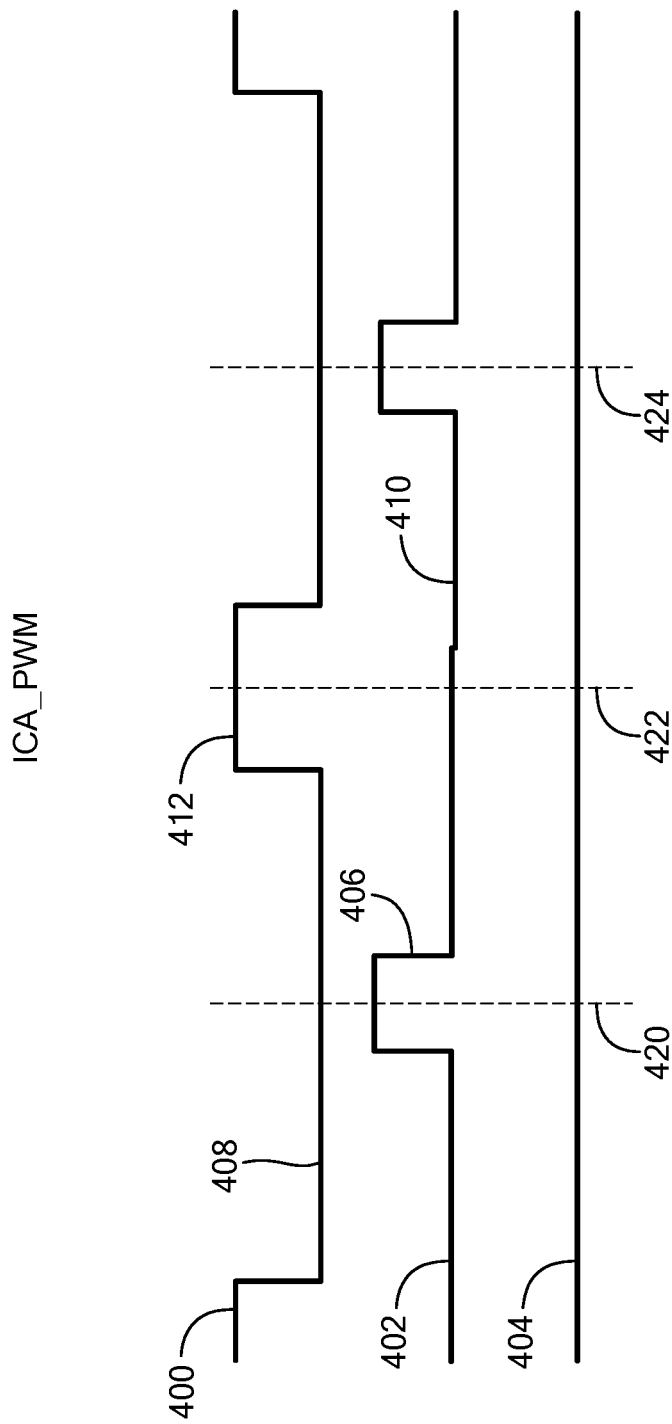
FIG. 4 is a timing diagram of motor phase signals.

Referring to FIG. 4, graph 400 is a timing diagram illustrating two-phase modulation for controlling the motor 102 according to the disclosure. The vertical axis represents voltage and the horizontal axis represents time. Waveform 400 represents the A phase motor control signal, waveform 402 represents the B phase motor control signal, and waveform 404 represents the C phase motor control signal (which signals may be the same as or similar to motor control signals 104a, 104b, 104c, respectively, of FIG. 1).

According to the disclosure, motor control circuit 104 (e.g., phase shift circuit 105) may modify the A phase waveform 400 by causing the A phase waveform 400 to be phase shifted by 180 degrees. In other words, the phase A and phase B control signals 400, 402 may be inverse center aligned such that the center of phase A high pulse 412 aligns with the center of phase B low pulse 410. It will be appreciated that inverse center alignment of the motor control signals can be achieved by phase shifting either of the phase A signal 400 or the phase B signal 402, as long as the result is that the signals 400, 402 are 180 degrees phase shifted with respect to each other so that the center of phase A high pulse 412 aligns with the center of phase B low pulse 410.

In general, at time 420, waveform 400 (the A phase) may be low and waveform 402 (the B phase) may be high. At time 422, waveform 400 (the A phase) may be high and waveform 402 (the B phase) may be low. More specifically, the high portion 406 of waveform 402 may be centered within the low portion 408 of waveform 400, and the high portion 412 of waveform 400 may be centered in the low portion 410 of waveform 402. The cycle continues at time 424 (where the high portion of waveform 402 is again centered in the low portion of waveform 400) and beyond. Thus, the center of phase A high pulse aligns with the center of phase B low pulse, and the center of phase B high pulse aligns with the center of phase A low pulse, thereby achieving inverse center alignment of the phase A and phase B motor control signals 400, 402, respectively.

Figure 5:
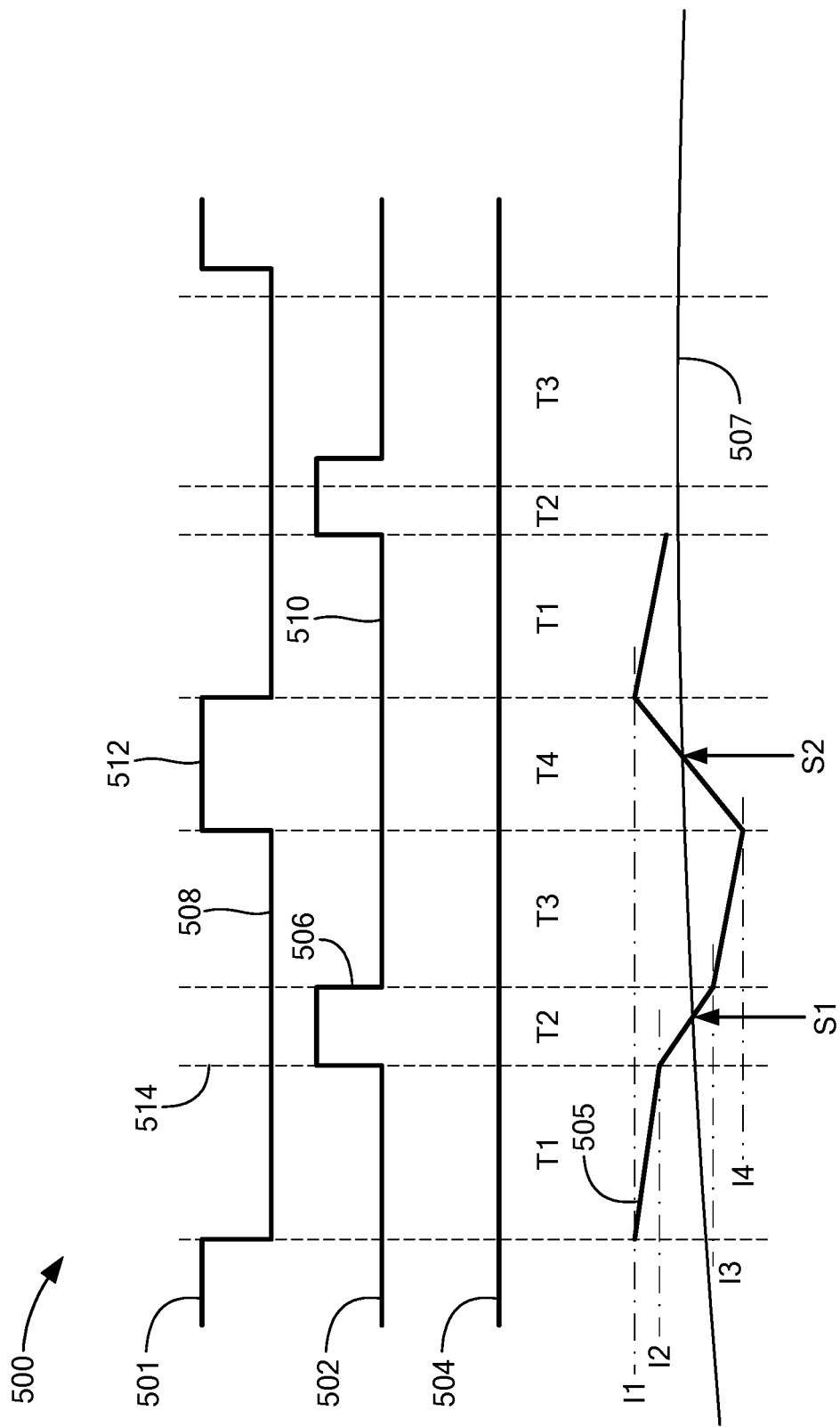
FIG. 5 is a graph of motor phase signals and motor current.

Referring to FIG. 5, graph 500 is a timing diagram of the phases of motor control system 100 and the current through one phase of motor 102. The horizontal axis represents time. The vertical axis of waveforms 500, 502, and 504 represents voltage. The vertical axis of waveform 505 represents current. For example, waveform 505 may represent the current through shunt resistor 120 (see FIG. 1).

Waveform 501 represents the A phase motor control signal, waveform 502 represents the B phase motor control signal, and waveform 504 represents the C phase motor control signal (which signals may be the same as or similar to motor control signals 104a, 104b, 104c, respectively, of FIG. 1). In this example, like the example in FIG. 4, phase shift circuit 105 of motor control circuit 104 may cause the A phase waveform 501 to be phase shifted by 180 degrees. In other words, at time S1, waveform 501 (the A phase) may be low and waveform 502 (the B phase) may be high. At time S2, waveform 501 (the A phase) may be high and waveform 502 (the B phase) may be low.

Also, the high portion 506 of waveform 502 may be centered within the low portion 508 of waveform 501, and the high portion 512 of waveform 501 may be centered in the low portion 510 of waveform 502. Thus, the center of phase A high pulse aligns with the center of phase B low pulse, and the center of phase B high pulse aligns with the center of phase A low pulse.

The ripple of current waveform 505 may cause errors when sampling the current through motor 102. For example, the average current is shown by line 507. Thus, if sampling were to occur at the beginning of time T1 and the beginning of time T3, for example, the calculated average current may be higher than the actual average current 507. However, the current at S1 is about midway through the falling edge of the ripple and the current at S2 is about midway through the rising edge of the ripple. Thus, in embodiments, motor control circuit 104 may sample the output (or input) current of motor 102 at times S1 and S2 to minimize or eliminate error introduced into the calculation of motor current by the ripple of current waveform 505.

Generally, current waveform 505 will fall while phase A is not active during time periods T1, T2, and T3 (e.g. during low portion 508 of waveform 501) and rise while phase A is active during time period T4 (e.g. during high portion 512 of waveform 501). Because high portion 506 is centered within low portion 508, and because sample S1 is centered within high portion 506, sample S1 may also be centered within low portion 508. As a result, sample S1 may represent a center point of the falling portion of current waveform 505. Also, because sample S2 is centered within high portion 512, sample S2 may represent a center point of the rising portion of current waveform 505.

Additionally, the phase output patterns are the same in time period T1 and T3. In other words, during T1 and T3, phase A waveform 501 is low, phase B waveform 502 is low, and phase C waveform 504 is low. Therefore, if the motor is operating at a steady state, the phase current will be the same in periods T1 and T3. In other words, I1−I2=I3−I4 Also, the following formula applies:

$$S1A = \frac{I2+I3}{2} = \frac{I1+I4}{2} = S2A \qquad (1)$$

where I1, I2, I3, I4 represent the phase current levels at the beginning of periods T1, T2, T3, T4, respectively and S1A and S2A represent the actual phase A current at times S1 and S2, respectively. As is apparent, sampling A phase current at S2 will have no error. In some embodiments, a processor circuit may produce an average of samples S1, S2, S3, etc. The average value may also represent the average current through motor 102. Thus, sampling S1 and S2 in the center of high portion 506 and high portion 512, respectively, may reduce or eliminate error caused by current ripple of waveform 505 when calculating the average current through motor 102.

In embodiments, the ripple of waveform 505 and the sampling rate for sampling current may have a frequency that is greater than that of the average current 507 through motor 102. In embodiments, the sampling rate may be twice the Nyquist frequency (or greater) than that of waveform 505. Also, in embodiments, the frequency of waveform 505 may be twice the Nyquist frequency (or greater) than that of waveform 507. As a corollary, the PWM frequency of waveforms 501 and 502 may be greater than the motor frequency.

Figure 6:
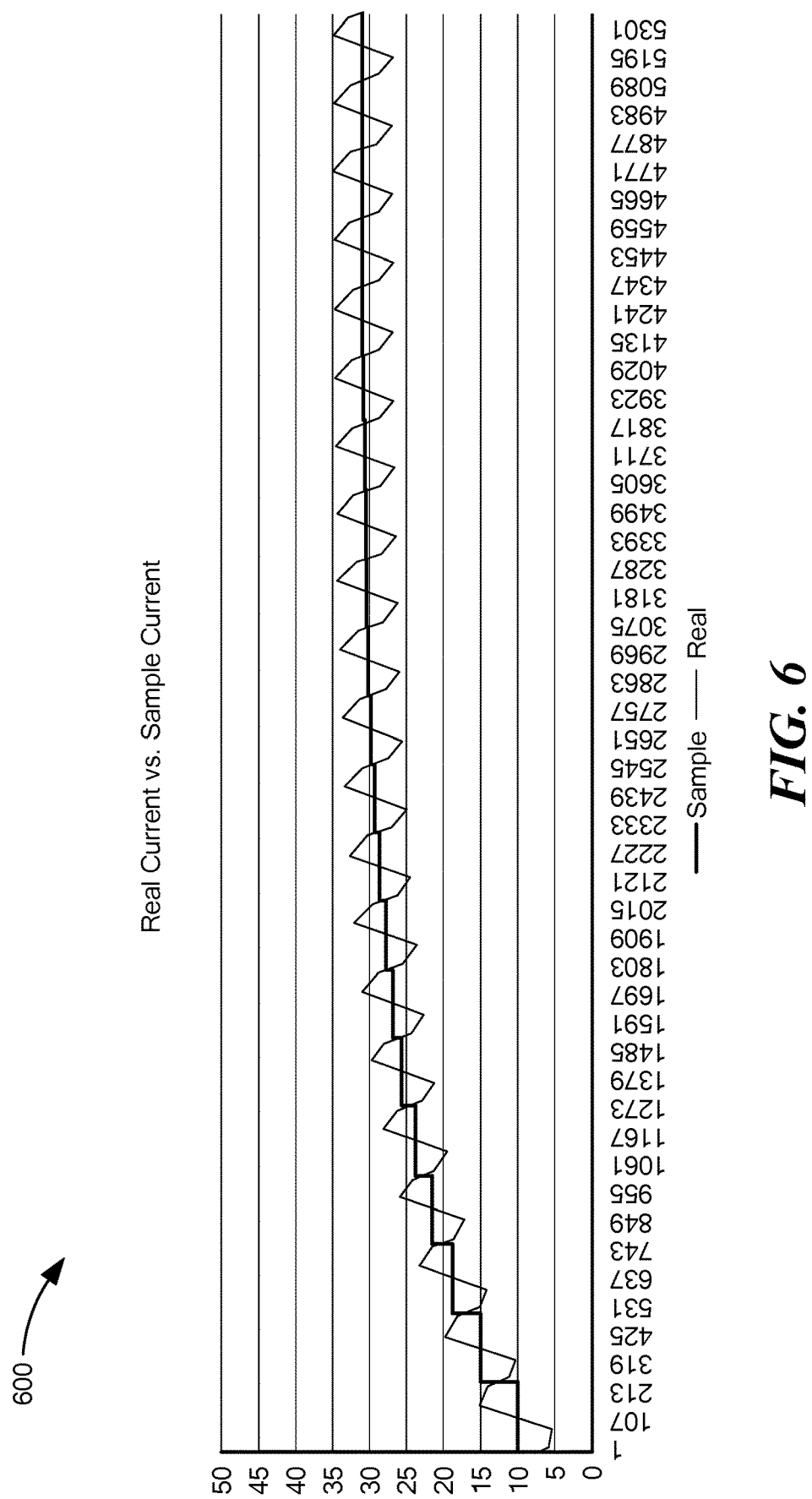
FIG. 6 is a graph of actual motor current and sampled motor current.

Referring to FIG. 6, graph 600 includes waveform 602 representing the real current through a motor phase and waveform 604 representing the sampled current by motor control circuit 104. The vertical axis represents arbitrary units of current and the horizontal axis represents arbitrary units of time. As shown, the sampled current 604 is centered with respect to the ripple of the real current 602, indicating that the sampled current contains no error or a minimal error (i.e., represents the actual average of the motor current).

The examples above illustrate operation of system 100 when using two-phase modulation. However, a person of ordinary skill in the art will recognize that the same systems and techniques may be used to measure current if system 100 is using three-phase modulation to control motor 102. Referring to FIG. 5, if three phase modulation is used, waveform 504 will have a rising edge sometime after time 514. However, waveforms 501 and 502 may remain unchanged (or similar) under three-phase modulation and, therefore, sampling at S1 and S2 may still reduce error caused by the ripple of waveform 505.

Various embodiments are described in this patent. However, the scope of the patent should not be limited to the described embodiments, but rather should be limited only by the spirit and scope of the following claims. All references cited in this patent are incorporated by reference in their entirety.

The invention claimed is:

1. A system comprising:
a motor having a plurality of phase coils;
a motor driver circuit having a plurality of switches coupled to the plurality of phase coils to drive current through the phase coils;
a motor controller circuit configured to provide a plurality of output control signals coupled to the plurality of switches, each output control signal associated with a respective phase coil to control the switches to drive current through the respective phase coil;
a phase circuit to modify a first output control signal of the plurality of output control signals to produce a modified control signal that is out of phase with a second output control signal of the plurality of output control signals; and
a current measuring circuit to measure a current through at least one of the phase coils by:
measuring the current during a first time period when the first output control signal is active; and
measuring the current during a second time period when the modified control signal is active.

2. The system of claim 1 wherein the current measuring circuit is further configured to average the current measured during the first time period and the current measured during the second time period.

3. The system of claim 1 wherein the plurality of phase coils comprises three phase coils.

4. The system of claim 3 wherein the plurality of output control signals comprises three output control signals.

5. The system of claim 1 wherein the plurality of output control signals are pulse-width modulated control signals.

6. The system of claim 5 wherein the first time period corresponds to a time period when the modified control signal is high and the second time period corresponds to a time period when the second output control signal is high.

7. The system of claim 1 wherein the modified control signal and the second output control signal are about 180 degrees out of phase.

8. The system of claim 1 wherein the current measuring circuit is configured to measure the current at a midpoint of the first time period and at a midpoint of the second time period.

9. The system of claim 1 further comprising a single shunt resistor coupled to the current measuring circuit.

10. The system of claim 1 wherein the phase circuit comprises a phase shift circuit that shifts the center of the first output control signal by a half-period.

11. A circuit comprising:
a motor driver circuit having a plurality of switches configured to be coupled to a plurality of phase coils of a motor to drive current through the plurality of phase coils of the motor;
a motor controller circuit configured to provide a plurality of output control signals coupled to the plurality of switches, each output control signal associated with a respective phase coil to control the switches to drive current through the respective phase coil;
a phase circuit to modify a first output control signal of the plurality of output control signals to produce a modified control signal that is out of phase with a second output control signal of the plurality of output control signals; and
a current measuring circuit to measure a current through at least one of the phase coils by:
measuring the current during a first time period when the modified control signal is active; and
measuring the current during a second time period when the second output control signal is active.

12. The circuit of claim 11 wherein the current measuring circuit is further configured to average the current measured during the first time period and the current measured during the second time period.

13. The circuit of claim 11 wherein the plurality of phase coils comprises three phase coils.

14. The circuit of claim 13 wherein the plurality of output control signals comprises three output control signals.

15. The circuit of claim 11 wherein the output control signals are pulse-width modulated control signals.

16. The circuit of claim 15 wherein the first time period corresponds to a time period when the modified control signal is high and the second time period corresponds to a time period when the second output control signal is high.

17. The circuit of claim 11 wherein the modified control signal and the second output control signal are about 180 degrees out of phase.

18. The circuit of claim 11 wherein the current measuring circuit is configured to measure the current at a midpoint of the first time period and at a midpoint of the second time period.

19. The circuit of claim 11 further comprising a single shunt resistor coupled to the current measuring circuit.

20. The circuit of claim 11 wherein the phase circuit comprises an inverter.

* * * * *